(12) United States Patent
Tsujikawa et al.

(10) Patent No.: US 6,465,967 B2
(45) Date of Patent: Oct. 15, 2002

(54) CONTROL CIRCUIT OF LIGHT EMITTING ELEMENT

(75) Inventors: Toshiaki Tsujikawa, Saitama (JP); Yoshio Sawada, Saitama (JP); Tadaaki Suda, Saitama (JP); Hiroyuki Basho, Saitama (JP)

(73) Assignees: Nippon Precision Circuits Inc., Tokyo (JP); Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/902,001

(22) Filed: Jul. 10, 2001

(65) Prior Publication Data

US 2002/0014849 A1 Feb. 7, 2002

(30) Foreign Application Priority Data

Jul. 21, 2000 (JP) ........................................ 2000-220705

(51) Int. Cl.[7] ............................. G09G 3/10; G05F 1/00
(52) U.S. Cl. ..................................... 315/169.1; 315/291
(58) Field of Search ............................. 315/291, 209 R, 315/224, 307, 312, 313, 314, 169.1, 169.2, 169.3

(56) References Cited

U.S. PATENT DOCUMENTS 5,793,163 A * 8/1998 Okuda ..................... 315/169.2
6,072,618 A * 6/2000 Takenaka .................... 359/187
6,292,284 B1 * 9/2001 Takauji et al. .............. 359/158
6,404,139 B1 * 6/2002 Sasaki et al. ............. 315/169.3

* cited by examiner

Primary Examiner—Don Wong
Assistant Examiner—Minh D A
(74) Attorney, Agent, or Firm—Jordan and Hamburg LLP

(57) ABSTRACT

To make compatible low consumption power formation of a control circuit of a light emitting element and high frequency formation of operational frequency band constituting a variety of usable combination elements of light emitting elements and light receiving elements, bias current is provided to a current mirror for dividing monitor current of a photodiode PD1 by a current source to thereby compensate drive function of a post stage in driving thereof by low current. Reference voltage of a current-voltage conversion portion is set in accordance with an input range of an operational amplifier of a gain adjusting portion at a post stage and input to the operational amplifier is fitted to an input range optimizing amplifying function. There are provided switching circuits SW1 and SW2 for selectively supplying monitor current from two photodiodes to respective APC loops of laser diodes LD1 and LD2 to thereby deal with a 2LD-1PD element and two of 1LD-1PD elements.

8 Claims, 7 Drawing Sheets

CONTROL CIRCUIT OF LIGHT EMITTING ELEMENT

BACKGROUND OF THE INVENTION

1. Field of the Invention

The present invention relates to a control circuit of a light emitting element such as a semiconductor laser diode, particularly to a constitution of monitoring light emitting states of a plurality of light emitting elements by a single light receiving element and controlling individual light emitting elements by monitor current thereof.

2. Description of the Related Art

Conventionally, a discrete element integrated with a light emitting element and a light receiving element, for example, a discrete element integrated with a laser diode and a photodiode, is constructed by a pair constitution of one element of laser diode coupled with one element of photodiode (hereinafter, such an element is referred to as 1LD-1PD element). Therefore, it is general that an auto power control circuit (hereinafter, referred to as APC circuit) of a laser diode carries out light control with respect to 1LD-1PD element. For example, as shown by FIG. 6, a laser diode LD is made to emit light by generating drive current ILD from a driver circuit X1. When the laser diode LD emits light, monitor current IPD is generated at a photodiode PD and the current is converted into voltage by a current/voltage converting portion X2. There is calculated a difference between the voltage and reference voltage by an error amplifier X3 and a difference voltage component thereof is subjected to voltage to current conversion by the driver circuit X1 to thereby generate the drive current ILD. By such an APC loop, compensation of error current of the drive current ILD is carried out.

According to the constitution of FIG. 6, when a discrete element paired with two or more of laser diodes and one photodiode (hereinafter, referred to as 2LD-1PD element) is controlled, although drive current of two laser diodes cannot be controlled by single monitor current, there has been carried out a trial of an APC circuit for controlling drive current of two laser diodes by single monitor current, for example, there is provided a light amount control apparatus in Japanese Patent Laid-Open No. 209545/1998.

According thereto, as shown by FIG. 7, monitor current of a photodiode PD1 constituting a 2LD-1PD element along with laser diodes LD1 and LD2, is divided uniformly by a current dividing circuit DIV, distributed to amplifiers Y1 and Y2, respectively subjected to current-voltage conversion by the amplifiers Y1 and Y2 and output voltage of these is compared with reference voltage by comparators Y3 and Y4 in the comparators Y3 and Y4. When output voltage of the amplifiers Y1 and Y2 is lower than the reference voltage, the logical level of the output is determined as "L" and when the output voltage of the amplifiers Y1 and Y2 is higher than the reference voltage, the logical level is determined as "H". Outputs of the comparators Y3 and Y4 are respectively provided to sample hold control circuits (hereinafter, referred to as SH control circuits) Y5 and Y6. The SH control circuits Y5 and Y6 are provided with up/down counters, not illustrated, when an enable state is brought about, the outputs are upcounted or downcounted in accordance with the logical levels of the outputs of the comparators Y3 and Y4 and when a disable state is brought about, count values are held. The SH control circuits Y5 and Y6 upcount the outputs when the outputs of the comparators Y3 and Y4 are at "L" and downcount the outputs when the outputs are "H". The driver circuits Y7 and Y8 generate drive current ILD1 and ILD2 in accordance with count values of the SH control circuits Y5 and Y6. Single monitor current is divided in two by the current dividing circuit DIV and there is carried out compensation of error current of the drive current ILD1 and ILD2 similar to the constitution shown in FIG. 6 respectively by an APC loop including the amplifier Y1, the comparator Y3, the SH control circuit Y5 and the driver circuit Y7 and an APC loop including the amplifier Y2, the comparator Y4, the SH control circuit Y6 and the driver circuit Y8.

However, according to the constitution shown in FIG. 7, in the current dividing circuit DIV for dividing the monitor current of the photodiode, emitters of PNP bipolar transistors TR1, TR2 and TR3 are respectively connected to a common power source terminal via resistors R1, R2 and R3, a base and a collector of the transistor TR1 are connected to the photodiode and bases of the transistors TR2 and TR3 are connected to the base of the transistor TR1 to thereby constitute a current mirror circuit. Bias to the bases of the transistors TR2 and TR3 is constituted only by the monitor current of the photodiode and therefore, when the monitor current of the photodiode is reduced, drive function at post stages of the amplifiers Y1 and Y2 is deteriorated and an operational frequency band is attenuated. Therefore, it is difficult to make low consumption formation of the APC circuits and high frequency formation of operational frequency band compatible with each other.

Further, the amplifiers Y1 and Y2 are respectively provided with operational amplifiers Y9 and Y10, positive inputs thereof are connected to the ground via resistors R4 and R5 and connected to the current dividing circuit DIV via diodes D1 and D2 and variable resistors RV1 and RV2 and negative inputs thereof are connected to the voltage dividing circuit DIV via the diodes D1 and D2 and resistors R6 and R7. Input voltage to the operational amplifiers Y9 and Y10 is derived from voltage drop by the resistors connected to the ground and current-voltage conversion is carried out with a ground level as a reference. Therefore, it is difficult to fit the positive and negative inputs to input ranges capable of realizing optimum operation of the operational amplifiers Y9 and Y10 to thereby hamper high degree APCs. That is, when the inputs are received from the ground, generally, an input stage of the operational amplifier is constructed by a PNP bipolar transistor constitution as shown by FIG. 8. As a general disadvantage in the case of using such an input constitution, the frequency characteristic is worse than that of an NPN input stage constituting circuit (the function of the transistor is generally superior in the case of NPN). Further, when input or output is at a vicinity of 0 [V], there is a possibility that the transistor is brought into a saturated region and stability with regard to the frequency characteristic is deteriorated.

Further, although gain of the amplifiers Y1 and Y2 are adjusted to set by the variable resistors RV1 and RV2 connected to the inputs of the operational amplifiers Y9 and Y10, the frequency band and the phase are significantly varied by function of the operational amplifiers Y9 and Y10.

Further, the constitution of FIG. 7 is the circuit constitution specified to the 2LD-1PD element, the circuit constitution per se cannot be used as an APC circuit using a 1LD-1PD element or an APC circuit using two of 1LD-1PD elements and there is needed an APC circuit for separate use, which gives rise to an increase in the cost. For example, although in a printer apparatus, there is used a laser diode for scanning a printing drum, in a high grade machine, scanning is carried out at high speed and therefore, the machine is dealt with by a 2LD-1PD element or two of 1LD-1PD elements, which constitution is to be selected is determined by price and function of laser diode and in the case of a low grade machine, scanning may be carried out at low speed and the machine is dealt with by a 1LD-1PD element. Therefore, APC circuits need to prepare for different machines, which results in an increase in the cost.

SUMMARY OF THE INVENTION

Hence, according to the invention ,by connecting a current source to a collector of respective bipolar transistor constituting a current mirror for dividing monitor current of a light receiving element and providing bias current thereto, drive function of a post stage is compensated and attenuation of operational frequency band is restrained.

Further, reference voltage of a current-voltage conversion portion is set in accordance with an input range of an amplifier at a post stage and input to the post stage amplifier is fitted to an input range optimizing amplifying function thereof. Further, by providing a differential amplifier for setting gain at a gain adjusting portion for adjusting gain of output voltage, a variation of frequency band or phase caused by adjusting the gain is restrained.

Further, there is provided a switching portion for selectively supplying monitor current from a plurality of light receiving elements to a plurality of drive circuits for generating drive current to thereby enable selection of whether a plurality of drive circuits are controlled by monitor current. of a desired one of the light receiving element or controlled by monitor current of the individual light receiving element.

DETAILED DESCRIPTION OF THE PREFERRED EMBODIMENTS

Figure 1:
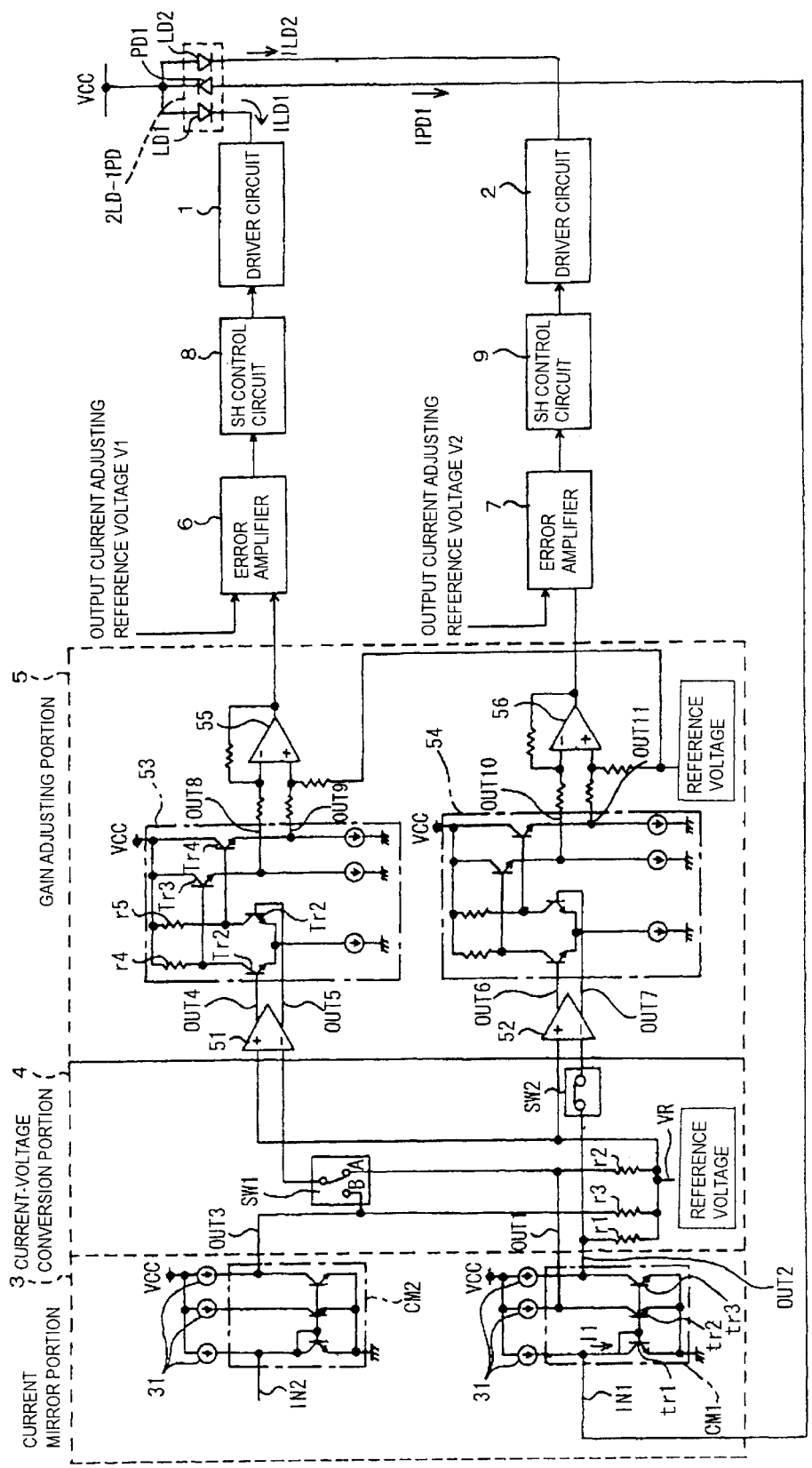
FIG. 1 is a block diagram for explaining a constitution of an APC circuit, particularly an APC circuit of a 2LD-1PD element according to an embodiment of the invention.

An explanation will be given as follows of details of a control circuit of a light emitting element according to the invention in line with an auto power control circuit (hereinafter, APC circuit) of a laser diode according to an embodiment shown in FIG. 1. The APC circuit according to the example is not only used for controlling a 2LD-1PD element but can be used as an APC circuit for controlling two of 1LD-1PD elements. Driver circuits 1 and 2 supply drive current to laser diodes LD1 and LD2 to thereby make the laser diodes LD1 and LD2 emit light. In this case, the laser diodes LD1 and LD2 along with a single photodiode PD, are constituted as a single discrete element or a 2LD-1PD element. When the laser diodes LD1 and LD2 emit light, monitor current IPD is generated at the photodiode PD1.

A current mirror portion 3 is provided with two current mirrors CM1 and CM2. An input terminal IN1 of the current mirror CM1 is connected to the photodiode PD1 for dividing monitor current IPD1 in two and outputting thereof from output terminals OUT1 and OUT2. The current mirror CM2 is for controlling two 1LD-1PD elements, mentioned later. In FIG. 1, an input terminal IN2 of the current mirror CM2 is floated. Both of the current mirrors CM1 and CM2 are constituted by NPN bipolar transistors tr1 through tr3 bases thereof are commonly connected to each other and collectors of the transistors tr1 connected with the input terminals IN1 and IN2 are connected to bases thereof. Further, the collectors of the respective transistors are connected with current sources 31 for supplying bias current to the current mirrors CM1 and CM2. Thereby, even with respect to weak monitor current, output current sufficient for driving post stages can be generated at the respective output terminals of the current mirrors CM1 and CM2.

A current-voltage conversion portion 4 is provided with resistors r1 through r3 terminals on one side of which are connected to reference voltage 41, a terminal on other side of the resistor r1 is connected to the output terminal OUT2 of the current mirror circuit CM1, a terminal of the resistor r2 on other side is connected to the output terminal OUT1 of the current mirror circuit CM1 and a terminal of the resistor r3 on other side is connected to an output terminal OUT3 of the current mirror CM2. There are generated at the other terminals of the resistors r1 through r3, output voltage synthesized with voltage drop caused by the resistors r1 through r3 and current flowing therein and the reference voltage.

Further, the current-voltage conversion portion 4 is provided with switching circuits SW1 and SW2. The switching circuit SW1 connects other terminal A of the resistor r2 and other terminal B of the resistor r3 selectively to a negative phase input of an operational amplifier 51 of a gain adjusting portion 5 and in this case, the switching circuit SW1 is made ON to the side of the terminal A. The switching circuit SW2 connects the other terminal of the resistor r1 to a negative phase input of an operational amplifier 52 of the gain adjusting portion 5 and is always made ON. The switching circuit SW2 is for canceling shift of frequency bands produced on the input sides of the operational amplifiers 51 and 52 by providing the switching circuit SW1 and is a dummy having an input/output characteristic the same as that of the switching circuit SW1.

The gain adjusting portion 5 is constituted by the operational amplifiers 51 and 52 for inputting, differential amplifiers 53 and 54 for adjusting gain and operational amplifiers 55 and 56 for outputting. The reference voltage 41 is inputted to a positive phase input of the operational amplifier 51 and output voltages having phases inverted to each other are generated at an output terminal OUT4 and an inverted output terminal OUT5 by calculating the reference voltage and a voltage value provided to the negative phase input. Similarly, the reference voltage 41 is inputted also to a positive phase input of the operational amplifier 52 and output voltages having phases inverted to each other are generated at an output terminal OUT6 and an inverted output terminal OUT7. The differential amplifier 53 receives the output voltages from the output terminal OUT4 and the inverted output terminal OUT5 from the operational amplifier 52 as a differential input, adjusts gain thereof and generates output voltages having phases inverted each other from an output terminal OUT8 and an inverted output terminal OUT9. The amplifier 54 receives the output voltages from the output terminal OUT6 and the inverted output terminal OUT7 as a differential input and generates output voltages gain of which is similarly adjusted at an output terminal OUT10 and an inverted output terminal OUT11. Output voltages of the output terminal OUT8 and the inverted output terminal OUT9 are respectively provided to a negative phase input and a positive phase input of the operational amplifier 55 and the operational amplifier 55 amplifies the output voltages and outputs thereof to an error amplifier 6. The output voltages of the output terminal OUT8 and the inverted output terminal OUT9 are respectively provided to the negative phase input and the positive phase input of the operational amplifier 55 via resistors. The operational amplifier 55 receives the reference voltage via a resistor at the positive phase input and the output voltages and the reference voltage are calculated and amplified and outputted to an error amplifier 6. Output voltages of the output terminal OUT10 and the inverted output terminal OUT11 are provided to a negative phase input and a positive phase input of the operational amplifier 56 respectively via resistors, the operational amplifier 56 receives the reference voltage at the positive phase input via a resistor and the output voltages and the reference voltage are calculated and amplified and. outputted to an error amplifier 7.

The error amplifiers 6 and 7 compare the output voltages outputted from the operational amplifiers 55 and 56 with reference voltages, when the output voltage is lower than the reference voltage, a logical level of the output is determined as "L" and when the output voltage is higher than the reference voltage, the logical level is determined as "H".

Sample hold control circuits (hereinafter, referred to as SH control circuits) 8 and 9 are provided with up/down counters, not illustrated, carry out upcounting or downcounting in accordance with logical levels of the outputs of the error amplifiers 6 and 7 when there is brought about an enable state and hold count values when there is brought about a disable state. The driver circuits 1 and 2 generate drive current ILD1 and ILD2 in accordance with the count values of the SH control circuits 8 and 9.

The above-described respective constituent elements of the example are integrated to a single chip except the laser diodes LD1 and LD2 and the photodiode PD1.

An explanation will be given of operation of the example as follows. First, an explanation will be given of operation of controlling the drive current ILD1 of the laser diode LD1 with regard to control operation of a 2LD-1PD element. When the 2LD-1PD element is used, the input terminal IN2 of the current mirror CM2 is floated and the terminal switching circuit SW1 is made ON to the side of the terminal A.

Figure 2:
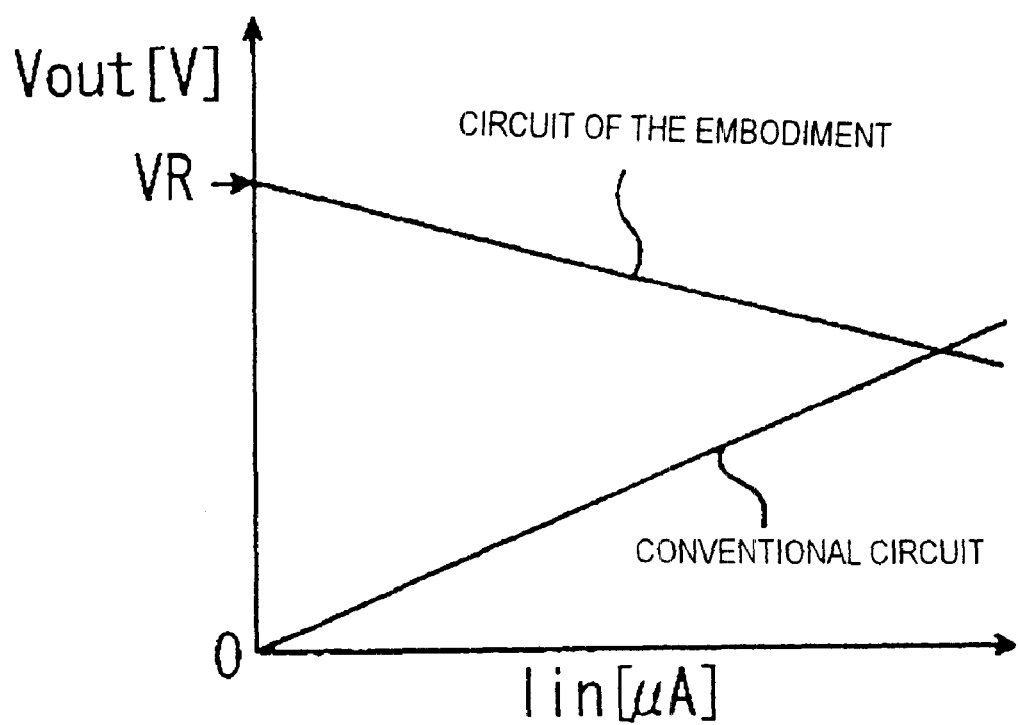
FIG. 2 is an input current-output voltage characteristic diagram for explaining a constitution of a current-voltage conversion portion of FIG. 1.

When the SH control circuit 8 is made enable, the drive current ILD1 in accordance with a count value of an inner counter of the SH control circuit 8 is outputted from the driver circuit 1 and the laser diode LD1 emits light. The SH control circuit 9 is made disable, generation of the drive current ILD2 from the driver circuit 2 is stopped and laser diode LD2 is brought into a light off state. By light emittance of the laser diode LD1, monitor current IPD1 flows at the photodiode PD1 and at the transistor tr1 of the current mirror CM1, there flows current I0 synthesized with the monitor current IPD1 and bias current from the current source 31. The current I0 is mirrored to the transistors tr2 and tr3 and current having the same current value flows Also at the transistors tr2 and tr3. The current I0 is synthesized with the monitor current IPD1 and the bias current from the current source 31 and therefore, the post stage can be driven even with respect to the monitor current having a very small value. The current I0 mirrored to the transistor tr2 is outputted from the output terminal OUT1 to the current-voltage conversion portion 4. The output terminal OUT1 is connected to the resistor r2 and the terminal A and there is generated at the terminal A, output voltage Vout (Vout=VR−(IPD×r2)) determined by voltage drop caused by output current IPD from the output terminal OUT1 and the resistor r2 and a reference voltage VR. The output voltage Vout is outputted to the operational amplifier 51 of the gain adjusting portion 5 via the switching circuit SW1. By setting a pertinent value to the reference voltage VR, the output voltage can be fitted to an optimum input range of the operational amplifier 51 at the post stage. FIG. 2 is a graph of a voltage characteristic of the current-voltage conversion portion. According to a conventional system of constituting the reference by the ground, the reference voltage (Iin=0[A]) of the current-voltage conversion portion becomes 0[V], however, according to the system of the example, the current-voltage conversion can be carried out by constituting the reference by the reference voltage VR[V]. The polarity of FIG. 2 is constituted by a polarity reverse to that of the conventional system in conformity with an actual circuit. Thereby, by using an NPN bipolar transistor type differential stage constitution making the frequency characteristic advantageous, the reference voltage can be selected in conformity with the frequency characteristic and the input voltage range of the gain adjusting portion after current-voltage conversion. That is, according to the conventional system, at a vicinity of output 0[V], there is a possibility of making the frequency characteristic unstable by bringing about a saturated region of transistor, however, according to the example, the possibility can be avoided.

In the gain adjusting portion 5, the operational amplifiers 51 generates output voltage having phases inverted to each other from the output voltage Vout at the output terminal OUT4 and the inverted output terminal OUT5 and the differential amplifier 53 receives the output voltage as a differential input. The differential amplifier 53 adjusts gain by logarithmically converting the output voltage Vout at a differential portion of a prestage comprising transistors Tr1 and Tr2 and exponentially converting thereof at an emitter follower constituted by transistors Tr3 and Tr4 at a post stage and generates output voltages having phases inverted to each other from the output terminal OUT8 and the inverted output terminal OUT9. According to the differential amplifier 53, with regard to a variation of the frequency in a closed loop constitution, the variation is determined by values of load resistors r4 and r5 and transistor bond capacitance values at the differential portion and therefore, a variation of band in making the gain variable can be restrained in comparison with gain adjustment using a conventional operational amplifier.

Output voltages of the output terminal OUT8 and the inverted output terminal OUT9 are respectively provided to the negative phase input and the positive phase input of the operational amplifier 55 and the operational amplifier 55 amplifies the output voltages and outputs thereof to the error amplifier 6.

The error amplifier 6 compares the output voltage of the operational amplifier 55 with reference voltage V1, when the output voltage is lower than the reference voltage, the logical level of the output is determined as "L" and when the output voltage is higher than the reference voltage, the logical level is determined as "H". The SH control circuit 8 carries out upcounting or downcounting in accordance with the logical level of the output of the error amplifier 6. The driver circuit 1 outputs the drive current ILD1 in accordance with the count value of an inner counter of the SH control circuit 8. As mentioned above, there is operated an APC loop by way of the photodiode PD1, the output terminal OUT1 of the current mirror CM1, the switching circuit SW1, the operational amplifier 51, the differential amplifier 53, the operational amplifier 55, the error amplifier 6, the SH control circuit 8 and the driver circuit 1 and the drive current ILD1 of the laser diode LD1 is controlled to a predetermined value in accordance with the reference voltage V1. At a timing at which the drive current ILD1 is made the predetermined value, the SH control circuit 8 is made disable and the control operation of the drive current ILD1 is finished.

When the drive current ILD2 of the laser diode LD2 is controlled, the SH control circuit 8 is made disable, the laser diode LD1 is brought into a light off state by stopping generation of drive current ILD1, the SH control circuit 9 is made enable, the drive current ILD2 is generated and the laser diode LD2 is made to emit light. Thereby, there is operated an APC loop by way of the photodiode PD1, the output terminal OUT2 of the current mirror CM1, the switching circuit SW2, the operational amplifier 52, the differential amplifier 54, the operational amplifier 56, the error amplifier 7, the SH control circuit 9 and the driver circuit 2 and the drive current ILD2 of the laser diode LD2 is controlled to a predetermined value in accordance with reference voltage V2 similar to the above-described control operation of the drive current ILD1.

As mentioned above, after controlling the drive currents ILD1 and ILD2 successively to the predetermined values, by the controlled drive current ILD1 and ILD2, the laser diodes LD1 and LD2 are driven.

Figure 3:
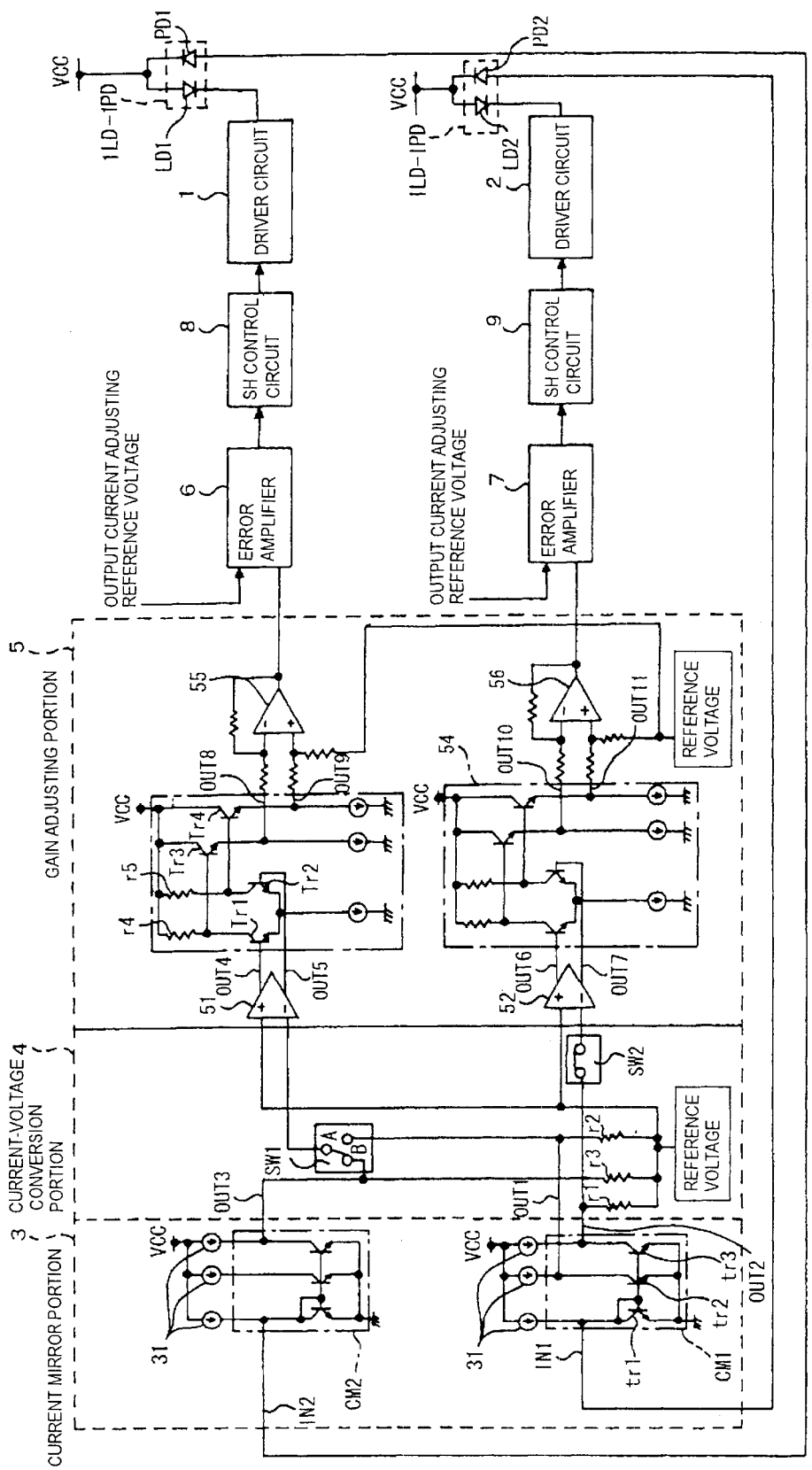
FIG. 3 is a block diagram for explaining a constitution of an APC circuit, particularly an APC circuit of two of 1LD-1PD elements according to an embodiment of the invention.

Next, an explanation will be given of a case of using the APC circuit of the example to control of two of 1LD-1PD elements in reference to FIG. 3. As shown by the drawing, a first 1LD-1PD element is constituted by the laser diode LD1 and the photodiode PD1 and a second 1LD-1PD element is constituted by a laser diode LD2 and a photodiode PD2. In the drawing, notations the same as those shown in FIG. 1 designate the same constituent elements and there is no difference in view of circuit constitution from that of FIG. 1 except that the photodiode PD1 is connected to the input terminal IN2 of the current mirror CM2 of the current mirror portion 3 and the photodiode PD2 is connected to the input terminal IN1 of the current mirror CM1 of the current mirror portion 3.

When the drive current ILD1 of the laser diode LD1 is controlled, firstly, the switching circuit SW1 is made ON to the side of the terminal B and the SH control circuit 8 is made enable. That monitor current IPD1 of the photodiode PD1 is provided to the input terminal IN2 of the current mirror CM2, at the output terminal OUT3, there is generated current 1PD synthesized with the monitor current IPD1 and bias current from the current source 31 and there is generated, at the terminal B, output voltage Vout (Vout= VR−(IPD×r2)) determined by voltage drop caused by the current IPD and the resistor r3 and the reference voltage VR. The output voltage is provided to the negative phase input of the operational amplifier 51 of the gain adjusting portion 5 via the switching circuit SW1. In this way, there is operated an APC loop by way of the photodiode PD1, the output terminal OUT3 of the current mirror CM2, the switching circuit SW1, the operational amplifier 51, the differential amplifier 53, the operational amplifier 55, the error amplifier 6, the SH control circuit 8 and the driver circuit 1 and the drive current ILD1 of the laser diode LD1 is controlled to a predetermined value in accordance with the reference voltage V1 similar to the control operation of the drive current ILD1, mentioned above.

Next, when the drive current ILD2 of the laser diode LD2 is controlled, the SH control circuit 9 is made enable. Thereby, there is operated an APC loop by way of the photodiode PD2, the output terminal OUT2 of the current mirror CM1, the switching circuit SW2, the operational amplifier 52, the differential amplifier 54, the operational amplifier 56, the error amplifier 7, the SH control circuit 9 and the driver circuit 2 and the drive current ILD2 of the laser diode LD2 is controlled to a predetermined value in accordance with the reference voltage V2 similar to the control operation of the drive current ILD1, mentioned above.

As described above, according to the example, by only switching the switching circuit SW1, either of control of the 2LD-1PD element and control of two of 1LD-1PD elements can be dealt with. Further, control of a single 1LD-1PD element can naturally be dealt with. Thereby, by the single APC circuit, various specifications can be dealt with and there can be dispensed with the cost of preparing APC circuits for respective specifications. Further, since the switching circuit SW2 is provided as a dummy, a shift between frequency bands of APC loops can be eliminated and two of the laser diodes can be controlled with the same accuracy in a high frequency band.

Figure 4:
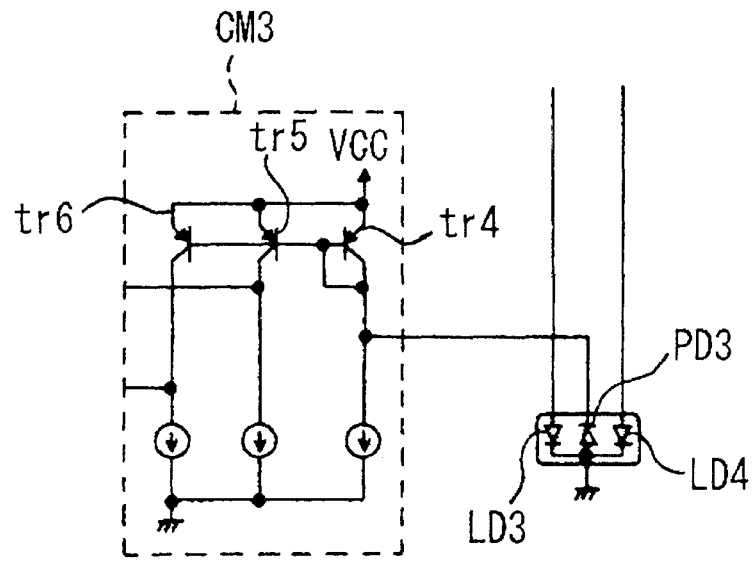
FIG. 4 is an explanatory view for explaining, other constitution of current mirror of an APC circuit according to an embodiment of the invention.

Further, although according to the above-described embodiment, the NPN bipolar transistors are used as the current mirror, the invention is not limited thereto. As shown by FIG. 4, there may be constituted a current mirror CM3 using PNP bipolar transistors tr4 through tr6 and in this case, the constitution is fitted to laser diodes LD3 and LD4 of a cathode common type. An anode of a photodiode PD3 is grounded. Further, a current mirror is not limited to a constitution using bipolar transistors but MOS transistors may be used.

Further, although according to the above-described embodiment, a description has been given of constitutions using the 2LD-1PD element and two of the. 1LD-1PD elements, the invention is not limited thereto. For example, when the invention deals with a 3LD-1PD element, by adding one transistor constituting a current mirror and adding a current source for providing bias current to the transistor, an APC loop of a laser diode added with the transistor can be constituted. Further, there may be constructed a constitution in which a similar current mirror is added and a switching element is provided to a current-voltage conversion portion to thereby switch to control of three of 1LD-1PD elements.

Figure 5:
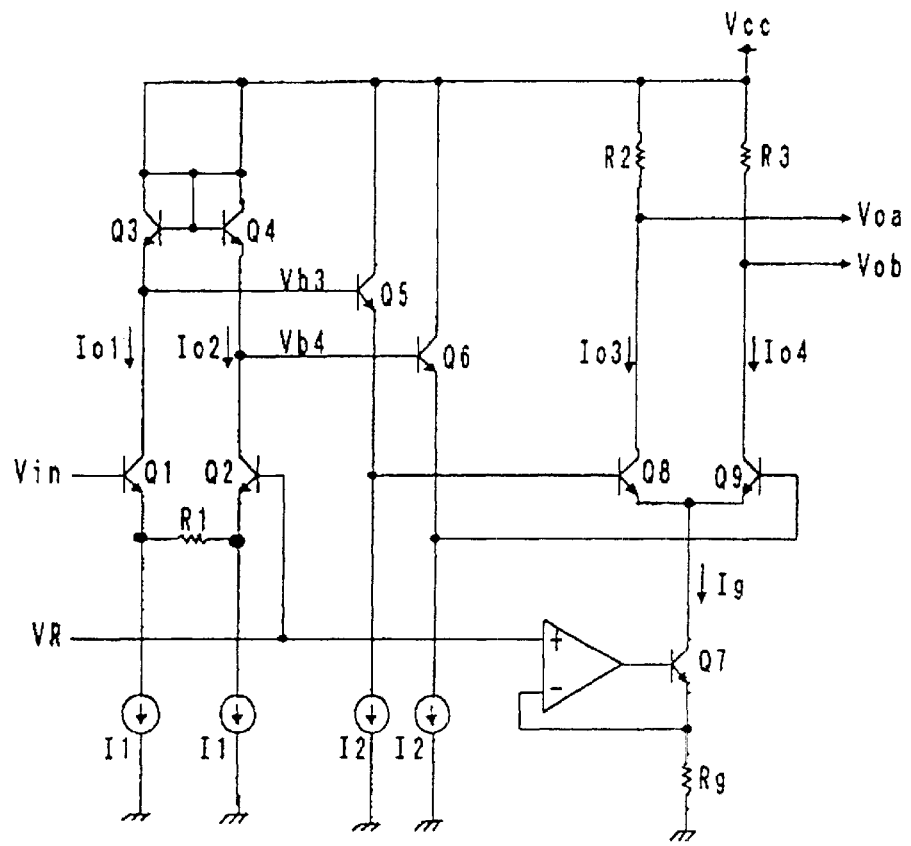
FIG. 5 is an explanatory view for explaining other constitution of a gain adjusting portion of an APC circuit according to an embodiment of the invention.
Figure 6:
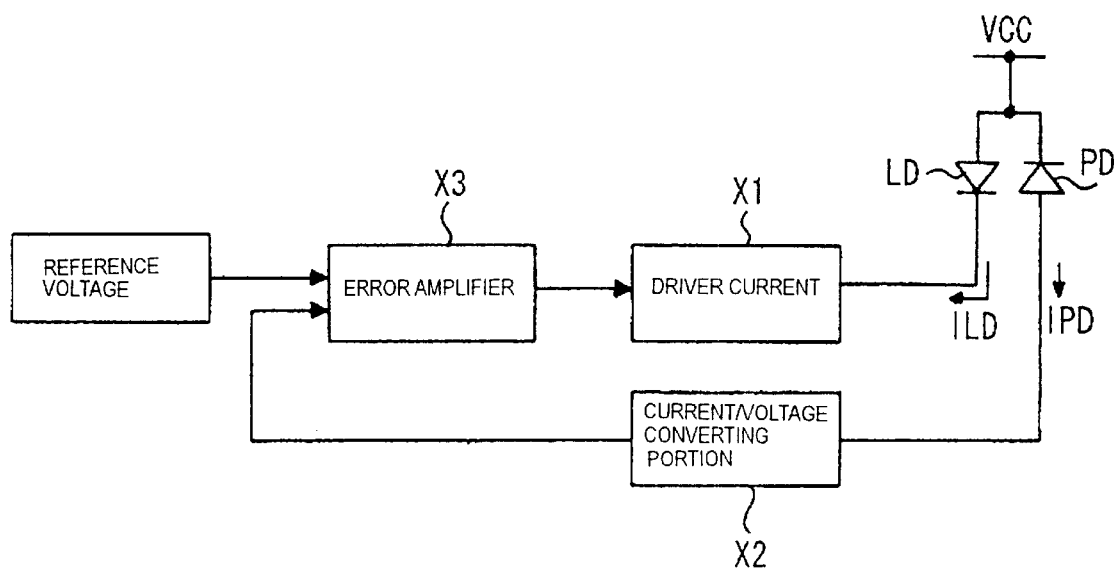
FIG. 6 is an explanatory view for explaining a conventional constitution of an APC circuit of a 1LD-1PD element.

Further, the operational amplifier 51, the differential amplifier 53, the operational amplifier 55 and the operational amplifier 52, the differential amplifier 54 and the operational amplifier 56 of the gain adjusting portion 5, can respectively be replaced by a gain adjusting portion shown by FIG. 5.

Figure 7:
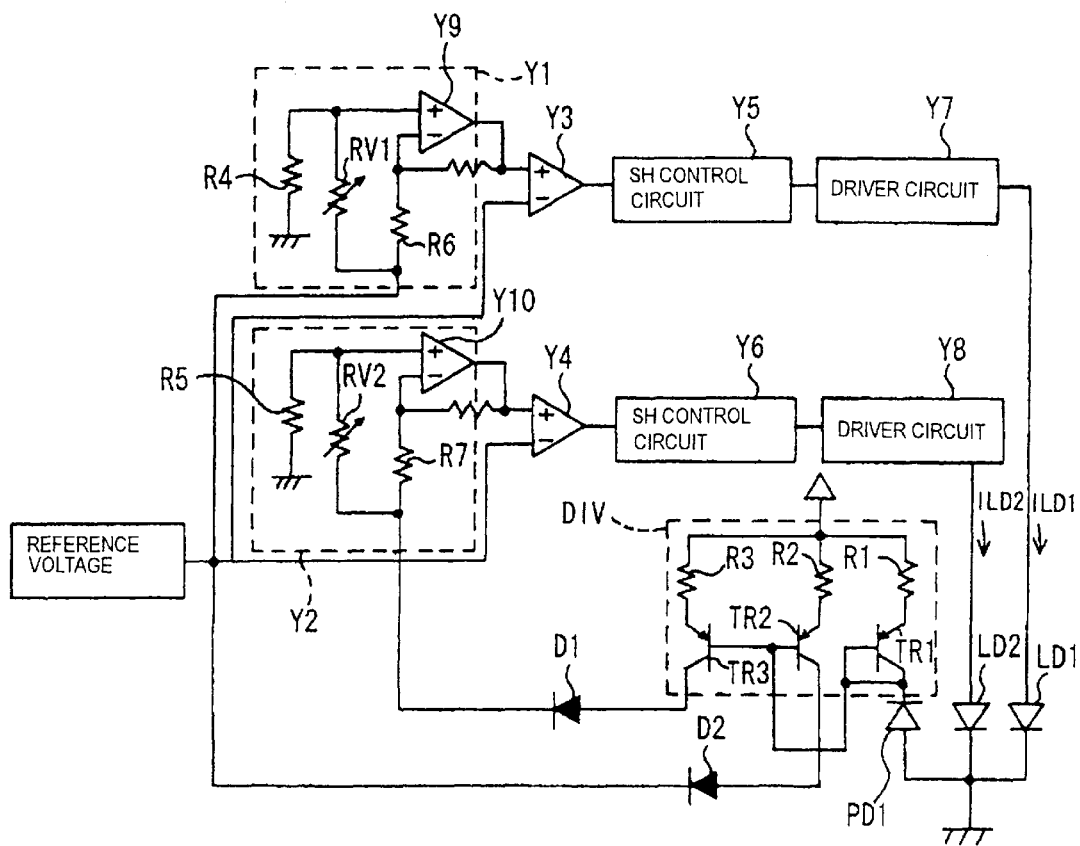
FIG. 7 is an explanatory view f or explaining a conventional constitution of an APC circuit of a 2LD-1PD element.
Figure 8:
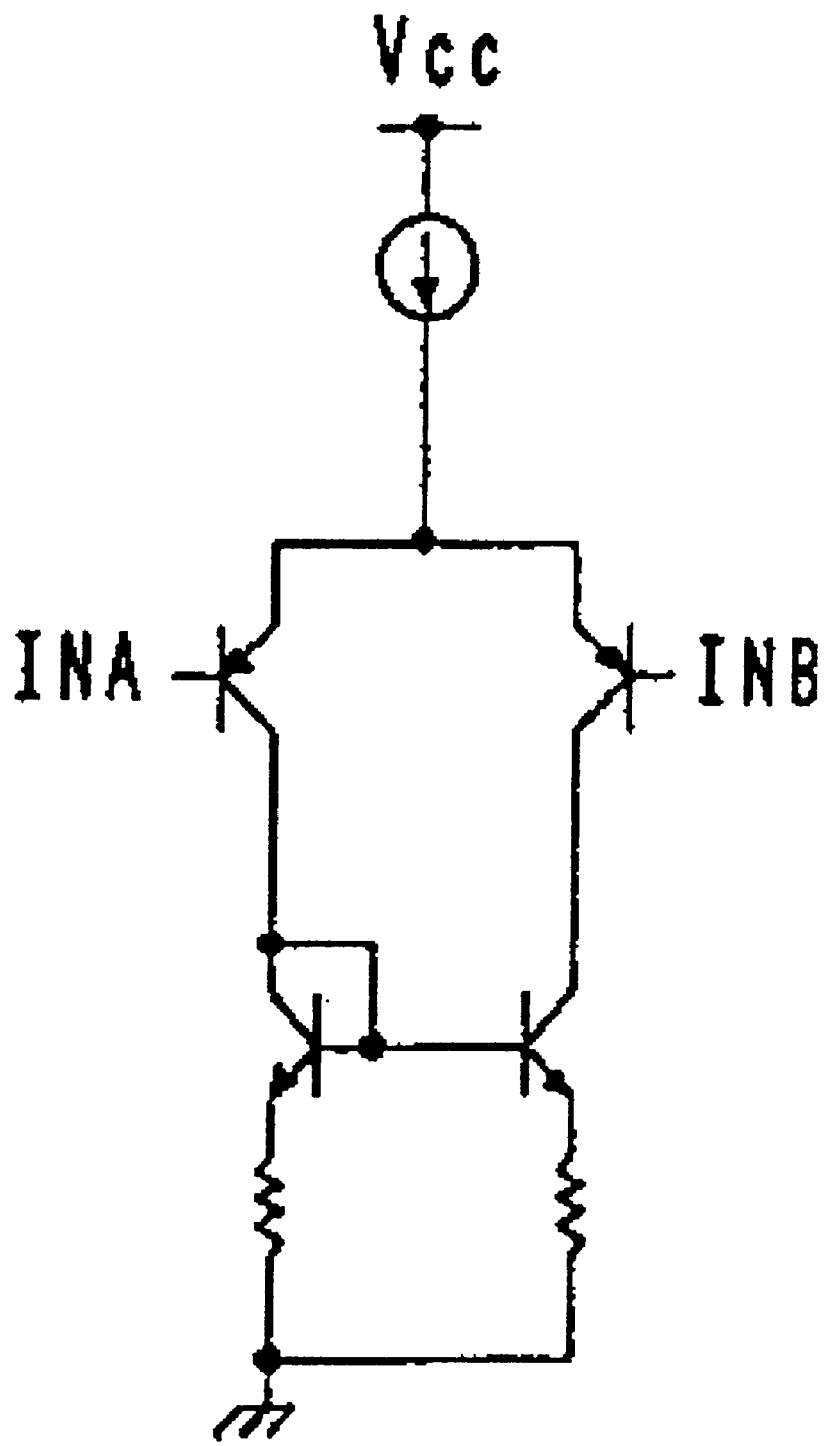
FIG. 8 is an explanatory view for explaining a constitution of an amplifier of FIG. 7.

A description will be given of operation of the gain adjusting portion of FIG. 5 as follows. Further, for convenience of explanation, in the drawing, although notations of resistors R1 through R3 are duplicated with those of the resistors R1 through R3 shown in FIG. 7, the resistors are different from those shown in FIG. 7.

Output voltage subjected to voltage conversion by the current-voltage conversion portion 4, is inputted from a terminal Vin. The voltage Vin is converted from voltage to current by the following equations.

$$Io1=2\times I1[(VR-Vin)/R1]$$

$$Io2=2\times I1[(VR+Vin)/R1]$$

Currents Io1 and Io2 are converted into the following voltages by diodes Q3 and Q4.

$$Vb3=Vt\times ln(Io1/Is)$$

$$Vb4=Vt\times ln(Io2/Is)$$

where Vt:kt/q, k:Boltzman constant, q: charge amount of electron, T: absolute temperature [K], Is: transistor saturated current.

When a voltage difference between voltage Vb3 and Vb4 is defined as ΔVb, the following equation is established.

$$\Delta Vb=Vb3-Vb4=kT/q\times(Io1/Io2)$$

The voltage difference ΔVb is transmitted to a differential stage Q8 and Q9 via transistors Q5 and Q6 and converted into current by the following equations.

$$Io3=Hfe/(1+Hfe)-Ig/(1+exp(1/Vt\times \Delta Vb)$$

$$Io4=Hfe/(1+Hfe)\times Ig/(1+exp(-1/Vt\times \Delta Vb)$$

where Hfe: current amplification rate of transistor, Ig: set current by Rg, Ig=VR/Rg.

Output voltages Voa and Vob are calculated by the following equations. Either of them is provided to the error amplifier 6.

$$Voa=Io3\times R2$$

$$Vob=Io4\times R3$$

From the above-described equations, when the input voltage Vin is made constant, in the case of making variable an amplitude of the output voltage, by making variable RG resistance and making variable Ig current, the amplitude value can be adjusted.

Although according to the above-described embodiment, the laser diode is used as a light emitting element, the invention is not limited thereto but a light emitting diode (LED) may be used.

According to the invention, by connecting the current source to the collector of the respective bipolar transistor constituting the current mirror circuit for dividing the monitor current of the light receiving element and providing the bias current thereto, even with very small monitor current, the drive function of the post stage can be compensated and attenuation of the operational frequency band can be restrained.

Further, the reference voltage of the current-voltage conversion portion is set in accordance with the input range of the amplifier at the post stage and the input to the post stage amplifier is fitted to the input range optimizing the amplifying function. Further, by adjusting gain by using the differential amplifier, the variation of the frequency band and the phase caused by adjusting the gain can be restrained.

Further, there is provided the switching portion for selectively supplying the monitor current from the plurality of light receiving elements to the plurality of drive circuits for generating drive current to thereby enable selection of whether the plurality of drive circuits are controlled by the monitor current of a desired one of the light receiving elements or controlled by the monitor current of the individual light receiving element and the invention can deal with discrete elements having different numbers of light emitting elements and light receiving elements. The cost of providing control circuits for different kinds of the elements can be reduced.

What is claimed is:

1. A control circuit of a light emitting element which is a control circuit of a light emitting element comprising:

a current mirror for receiving monitor current from a light receiving element for detecting light amounts from a plurality of light emitting elements and outputting the monitor current in accordance with the detected light amounts and generating output current in correspondence with a number of the plurality of light emitting elements; and a current-voltage conversion portion for subjecting the output current to current-voltage conversion to thereby generate output voltage;

wherein the light amounts of the plurality of the light emitting elements are individually controlled by comparing the output voltage with reference voltage, further comprising:

a current source for supplying bias current to respective transistor constituting the current mirror.

2. The control circuit of a light emitting element according to claim 1:

wherein the current-voltage conversion portion comprises:

a terminal of a specific voltage determined in correspondence with an input range of an amplifier at a post stage; and a resistor one terminal of which is connected between the terminal and a terminal of generating the output current;

wherein the output voltage is generated at other terminal of the resistor.

3. The control circuit of a light emitting element according to claim 2, further comprising:

a gain adjusting portion for adjusting gain of the output voltage;

wherein the gain adjusting portion adjusts the gain by using a differential amplifier and individually controls the light amounts of the plurality of light emitting elements by comparing the output voltage the gain of which is adjusted with the reference voltage.

4. A control circuit of a light emitting element which is a control circuit of a light emitting element comprising:

a plurality of current mirrors provided in correspondence with respectives of a plurality of light receiving elements for detecting light amounts of a plurality of light emitting elements and outputting monitor current in accordance with the detected light amounts and receiving the monitor current from the corresponding light receiving elements and generating output currents in correspondence with a number of the plurality of light emitting elements;

a current-voltage conversion portion for generating a plurality of output voltages by subjecting the respective output currents of the plurality of current mirrors to current-voltage conversion; and a plurality of drive circuits provided in correspondence with respectives of the plurality of light receiving elements for supplying drive currents in accordance with a result of comparing the output voltages with reference voltage to corresponding ones of the light emitting elements, further comprising:

a switching portion for selecting whether the output voltage provided from any one of the plurality of current mirrors is outputted to the plurality of drive circuits or the output voltages provided from the plurality of current mirrors are outputted to respective corresponding ones of the drive circuits.

5. The control circuit of a light emitting element according to claim 4, further comprising:

a current source for supplying bias current to respective transistor constituting the current mirror.

6. The control circuit of a light emitting element according to claim 4 or 5:

wherein the current-voltage conversion portion comprises:

a terminal of a specific voltage determined in correspondence with an input range of an amplifier at a post stage; and a resistor one terminal of which is connected between the terminal and a terminal of generating the output current;

wherein the output voltage is generated at other terminal of the resistor.

7. The control circuit of a light emitting element according to claim 6, further comprising:

a gain adjusting portion for adjusting gain of the output voltage;

wherein the gain adjusting portion adjusts the gain by using a differential amplifier and the plurality of drive circuits generate the drive currents in accordance with the result of comparing the output voltages the gain of which is adjusted with the reference voltage.

8. The control circuit of a light emitting element according to of claim 6.

* * * * *